United States Patent
Vogelsang

(10) Patent No.: US 7,333,383 B2
(45) Date of Patent: Feb. 19, 2008

(54) FUSE RESISTANCE READ-OUT CIRCUIT

(75) Inventor: Thomas Vogelsang, Jericho, VT (US)

(73) Assignee: Infineon Technologies AG, Munich (DE)

( * ) Notice: Subject to any disclaimer, the term of this patent is extended or adjusted under 35 U.S.C. 154(b) by 170 days.

(21) Appl. No.: 11/210,055

(22) Filed: Aug. 23, 2005

(65) Prior Publication Data

US 2007/0053236 A1    Mar. 8, 2007

(51) Int. Cl.
*G11C 17/18* (2006.01)
(52) U.S. Cl. ................. 365/225.7; 365/96
(58) Field of Classification Search ........... 365/225.7, 365/96
See application file for complete search history.

(56) References Cited

U.S. PATENT DOCUMENTS

| | | | |
|---|---|---|---|
| 6,185,705 B1 * | 2/2001 | Cutter et al. | 714/721 |
| 6,307,490 B1 * | 10/2001 | Litfin et al. | 341/121 |
| 6,590,804 B1 * | 7/2003 | Perner | 365/158 |
| 2006/0044047 A1 * | 3/2006 | Porter | 327/512 |

* cited by examiner

*Primary Examiner*—Anh Phung
*Assistant Examiner*—Eric Wendler
(74) *Attorney, Agent, or Firm*—Patterson & Sheridan, L.L.P.

(57) ABSTRACT

Methods and apparatus for a more precise readout of fuse resistance than a conventional binary readout are provided. For some embodiments, a digital readout of fuse resistance may be obtained by selectively altering an effective reference resistance to which the fuse resistance is compared. For some embodiments, a direct analog readout may be obtained in addition to, or instead of, a digital resistance readout.

22 Claims, 8 Drawing Sheets

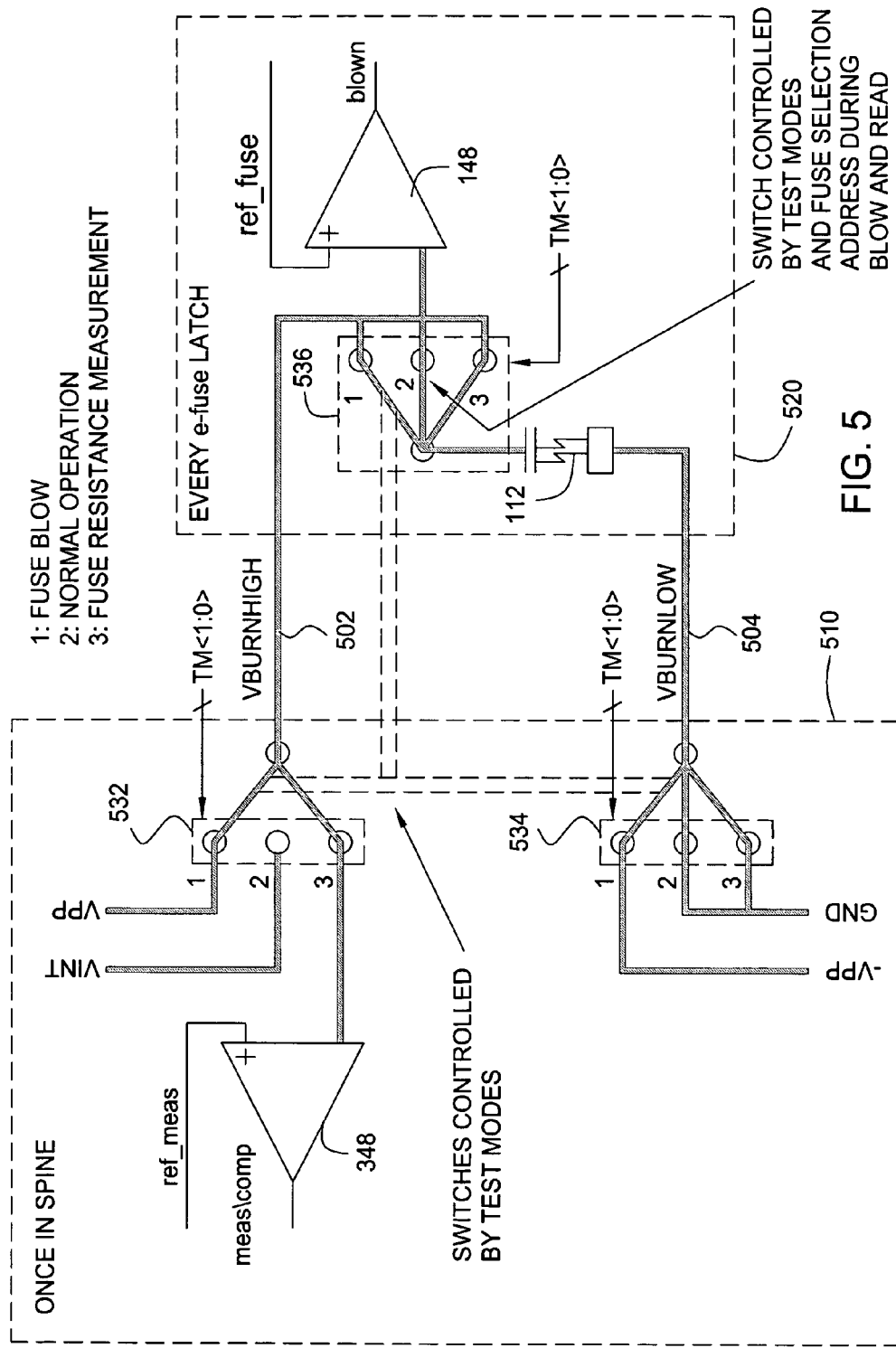

FUSE RESISTANCE READ-OUT CIRCUIT

BACKGROUND OF THE INVENTION

1. Field of the Invention

The invention generally relates to integrated circuit devices utilizing fuse elements and, more particularly, to techniques for reading out the resistance of such fuse elements after a blow process.

2. Description of the Related Art

Fuses are used in integrated circuit (IC) devices for a variety of reasons. As an example, in dynamic random access memory (DRAM) devices, fuses are often used to select redundant circuits to replace failing memory elements, as well as trim various timing and voltage generations circuits. As used herein, the term fuse generally refers to an element whose associated resistance is changed significantly after the element is physically altered (hereinafter "blown"), for example by "cutting" the element with a laser or applying a predetermined programming or "blow" voltage across the element.

Fuses whose resistance is decreased after being blown are generally referred to as antifuses. One type of antifuse is a gate oxide (GOX) antifuse, which has a reduced resistance after being blown via application of a blow voltage. Sensing circuits are typically provided on devices utilizing fuses that determine the state of the fuses (i.e., blown or not-blown) and store a corresponding logic value in a set of fuse latches that control device operation.

In certain circumstances, possibly caused by changes in the element structure or programming voltage due to manufacturing process variations, the decrease in resistance of an antifuse may not be sufficient for this sensing circuitry to determine the antifuse has been blown. Therefore, it is often desirable to read out the resistance of one or more fuses, by a test device, after a blow process to assure the resistance of fuses that were blown has decreased adequately to assure the sensing circuits will detect the fuses as being blown.

Conventional read out circuitry typically only provides a binary (e.g., "blown" or "not-blown") indication utilizing the fuse latch circuitry. Unfortunately, a detailed characterization of the fuse resistances is not possible from this binary indication. As a result, antifuses with marginal decreases in resistance may be indicated as blown during test read-out. However, in the field, changes in operating conditions may cause these fuses to be detected as not blown by the fuse latch circuits, which may cause erroneous device operation and possibly catastrophic failure.

Accordingly, what is needed is an improved technique for reading out antifuse states, preferably that allows for detailed characterization of antifuse resistances after a blow process.

SUMMARY OF THE INVENTION

Embodiments of the invention generally provide methods and apparatus for reading out fuse resistance.

One embodiment provides a method for providing an indication of a resistance of a programmable fuse element within an integrated circuit device. The method generally includes (a) adjusting an effective reference resistance, (b) comparing the resistance across the fuse to the effective reference resistance, (c) if an outcome of the comparison is a first result, repeating steps (a) and (b), and (d) if the outcome of the comparison is a second result, providing an indication of the effective reference resistance.

Another embodiment provides a method for obtaining a digital readout of a resistance of a programmable fuse element within an integrated circuit device. The method generally includes (a) adjusting a number of transistors connected in parallel to control a current flow through a resistor having a known resistance, (b) monitoring an output of a comparator circuit that compares a voltage across the fuse element to a voltage across the resistor, (c) if the output of the comparator circuit is in a first state, repeating steps (a) and (b), and (d) if the output of the comparator circuit is in a second state, providing the number of transistors connected in parallel as an indication of the resistance across the programmable fuse element.

Another embodiment provides an integrated circuit device generally including a plurality of programmable fuse elements and readout circuitry configured to provide a non-binary indication of resistance of one or more of the programmable fuse elements.

Another embodiment provides an integrated circuit device. The device generally includes a plurality of programmable fuse elements, a comparator circuit for comparing a voltage across a selected one of the programmable fuse elements to a voltage across a reference resistor having a known resistance, and control circuitry. The control circuitry is generally configured to successively switch a number of transistors in parallel to control the amount of current flowing through the reference resistor until an output of the comparator circuit changes state.

Another embodiment provides an integrated circuit device generally including a plurality of programmable fuse elements, means for comparing a resistance of a selected one of the programmable fuse elements to an effective reference resistance, and control means for iteratively adjusting the effective reference resistance until an output of the comparing means changes state.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 5 illustrates exemplary antifuse blow, latch sensing, and resistance read-out circuits utilizing common signal traces, in accordance with one embodiment of the present invention;

DETAILED DESCRIPTION OF THE PREFERRED EMBODIMENT

Embodiments of the invention generally provide methods and apparatus a more precise readout of fuse resistance than that provided by a conventional binary (blown/not-blown) readout. For some embodiments, a "stepped" digital readout of fuse resistance may be obtained by selectively altering an effective reference resistance to which the fuse resistance is compared. For some embodiments, a direct analog readout may be obtained in addition, or instead of, a digital resistance readout.

To facilitate understanding, embodiments may be described below with reference to memory devices, such as DRAM devices, as a specific, but not limiting example of an application in which the techniques of reading out fuse resistance described herein may be used to advantage. However, those skilled in the art will recognize these techniques may be applied in a wide variety of devices that utilize fuses for various reasons. Further, while embodiments may be described with reference to anti-fuses (generally defined as a fuse whose resistance is lowered after a blow process), the techniques described herein may also be used to measure resistance of fuses whose resistance increases after a blow process.

An Exemplary System

Figure 1:
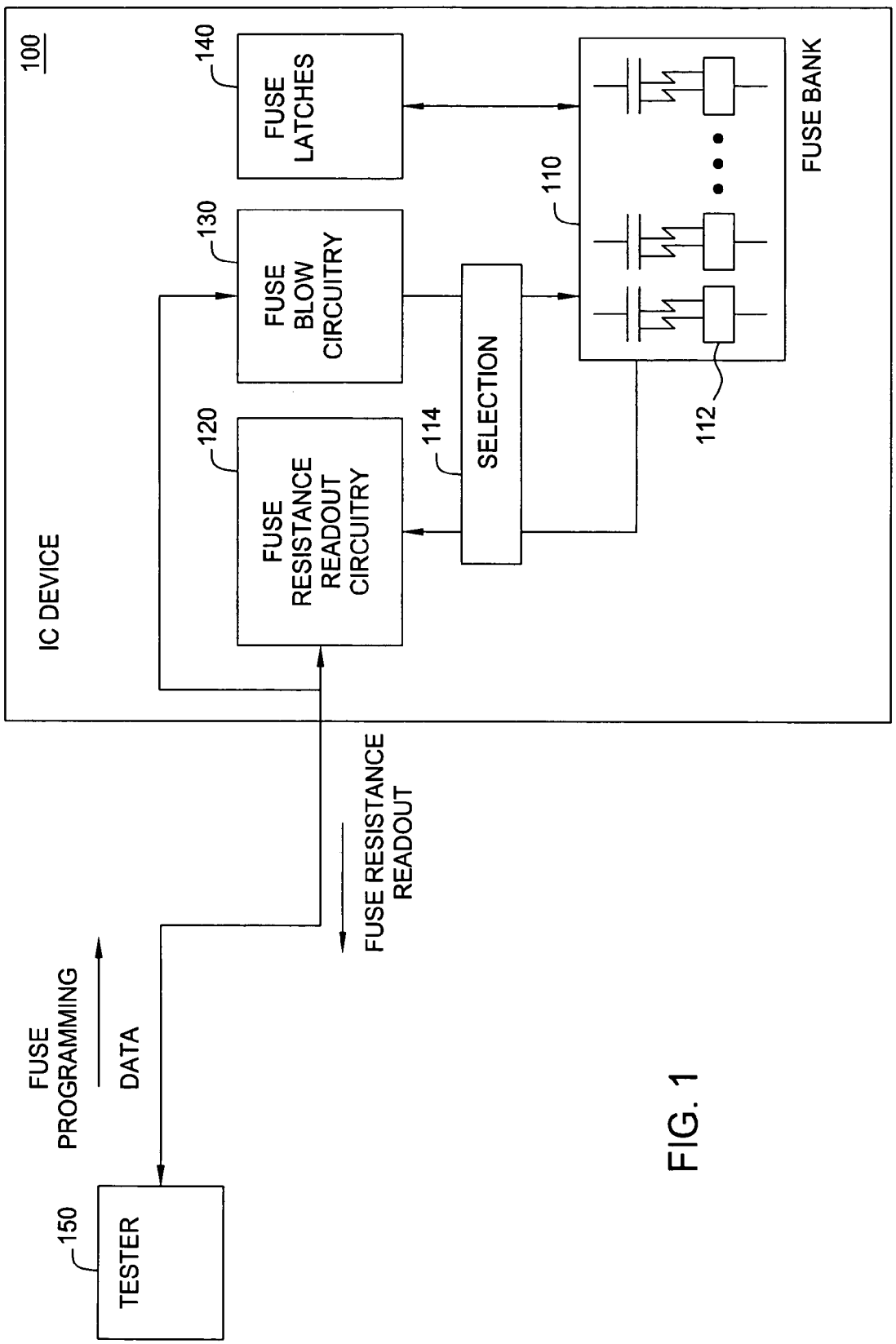
FIG. 1 illustrates an exemplary integrated circuit (IC) device incorporating fuse resistance read-out circuitry in accordance with embodiments of the present invention.

FIG. 1 illustrates an exemplary integrated circuit (IC) device 100 incorporating fuse resistance read-out circuitry 120 in accordance with embodiments of the present invention. The IC device 100 may be any type of device and may utilize a bank 110 of anti-fuses 112 for a variety of purposes. For some embodiments, the IC device 100 may be a DRAM device and the anti-fuses 112 may be utilized for various purposes, such as, repair purposes, trimming voltages, trimming timing circuits, storing identifying information, enabling/disabling particular features, and/or any other suitable purpose.

As illustrated, the IC device 100 may include fuse blow circuitry 130 to blow anti-fuses 112 of the fuse bank 110. For example, during a test process, an external tester 150 may identify a set of anti-fuses to blow by transferring fuse blow data (e.g., a string of 1's and 0's with 1's indicating fuses to be blown) to the fuse blow circuitry 130 via any suitable interface. In response, the fuse blow circuitry may blow the identified anti-fuses 112, for example, by applying a blow voltage to each identified anti-fuse 112. Such a blow process is typically performed in a sequential manner, with the blow voltage applied to a single selected one of the identified anti-fuses 112 at a time.

For some embodiments, the fuse blow circuitry 130 may utilize fuse selection circuitry 114 including any suitable components, such as a shift register, to select individual fuses. As illustrated, for some embodiments, the fuse selection circuitry 114 may be utilized by both the fuse blow circuitry 130 and the fuse readout circuitry 120 to select individual fuses to be blown or whose resistance is to be read out, respectively. As will be described in greater detail, by sharing fuse selection circuitry 114 between the fuse resistance readout circuitry 120 and the fuse blow circuitry 130, common signal paths may be utilized which may help minimize overall wire routing area consumed.

During normal operation, the state of anti-fuses 112 may be latched by fuse latches 140 and these latched values may be utilized to effect operation of the device 100 in the various manners listed above. While fuses are typically blown and read out sequentially, for example, to minimize the corresponding circuitry and peak current consumption, fuse states are typically latched in parallel to reduce latency. For example, during a power on sequence, the resistance of each anti-fuse 112 may be compared to a reference resistance by a corresponding fuse latch 140. If the anti-fuse resistance is below the reference resistance, the fuse is considered blown and a corresponding value (e.g., a logical 1) is latched.

Figure 2:
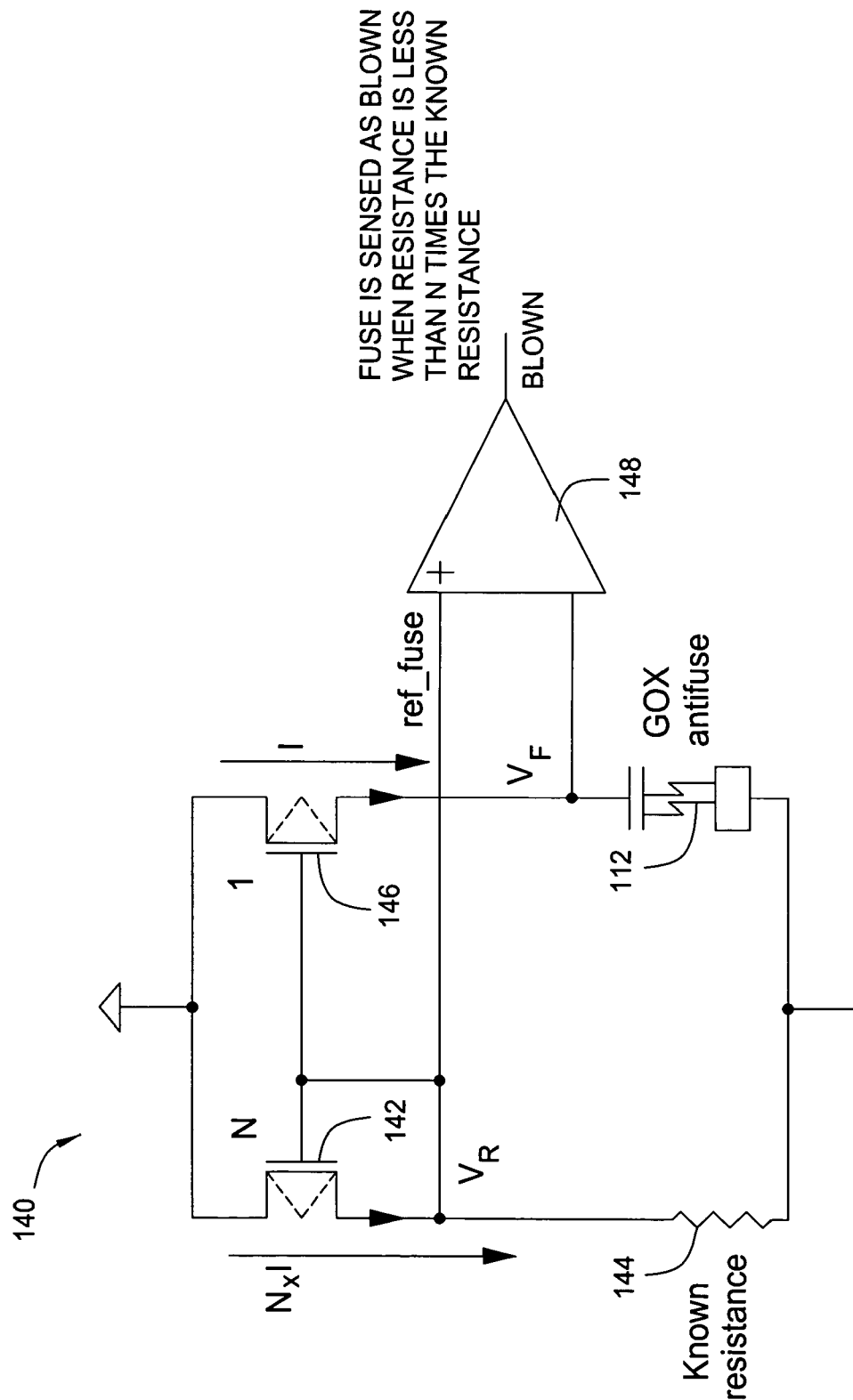
FIG. 2 illustrates an exemplary antifuse latch sensing circuit.

FIG. 2 illustrates a portion of an exemplary fuse latch circuit 140 configured to sense when an anti-fuse 112 is blown based on comparison with a reference resistance. One challenge presented is that the comparator 148 should be configured to switch at a relatively high resistance (e.g., approximately 4 M-Ohms), which would require a very large resistor to compare against using a traditional comparison circuit, which may present layout problems. However, for some embodiments, the fuse latch 140 may overcome this problem by utilizing a much smaller resistor 144 and increasing the effective resistance by a factor of N, for example, by utilizing current sources with different sized transistors 142 and 146 to control the current through the resistor 144 and the antifuse 112, respectively.

As illustrated, the transistor 142 results in increased current ($N \times I_{FUSE}$) flowing through a leg with the resistor 144, while the transistor 146 results in current ($I_{FUSE}$) flowing through the anti-fuse. The switching point of the comparator, then, will be governed by the following equation:

$$V_{FUSE} = V_{RES}, \text{ where}$$

$$V_{FUSE} = I_{FUSE} \times R_{FUSE}$$

$$V_{REF} = N \times I_{FUSE} \times R_{REF}$$

Substituting the second and third equations into the first, it can be seen that the anti-fuse will be sensed as blown when its resistance is less than N times the known resistance:

$$R_{FUSE} < N \times R_{REF}$$

In other words, by increasing the current through the reference resistor 144 by a factor of N, the effective reference resistance is effectively increased to $N \times R_{REF}$. Thus, a significantly smaller reference resistor may be used (e.g., 400 kOhm versus 4 MOhm assuming N=10), which may facilitate layout.

Stepped Fuse Resistance Readout

Figure 3:
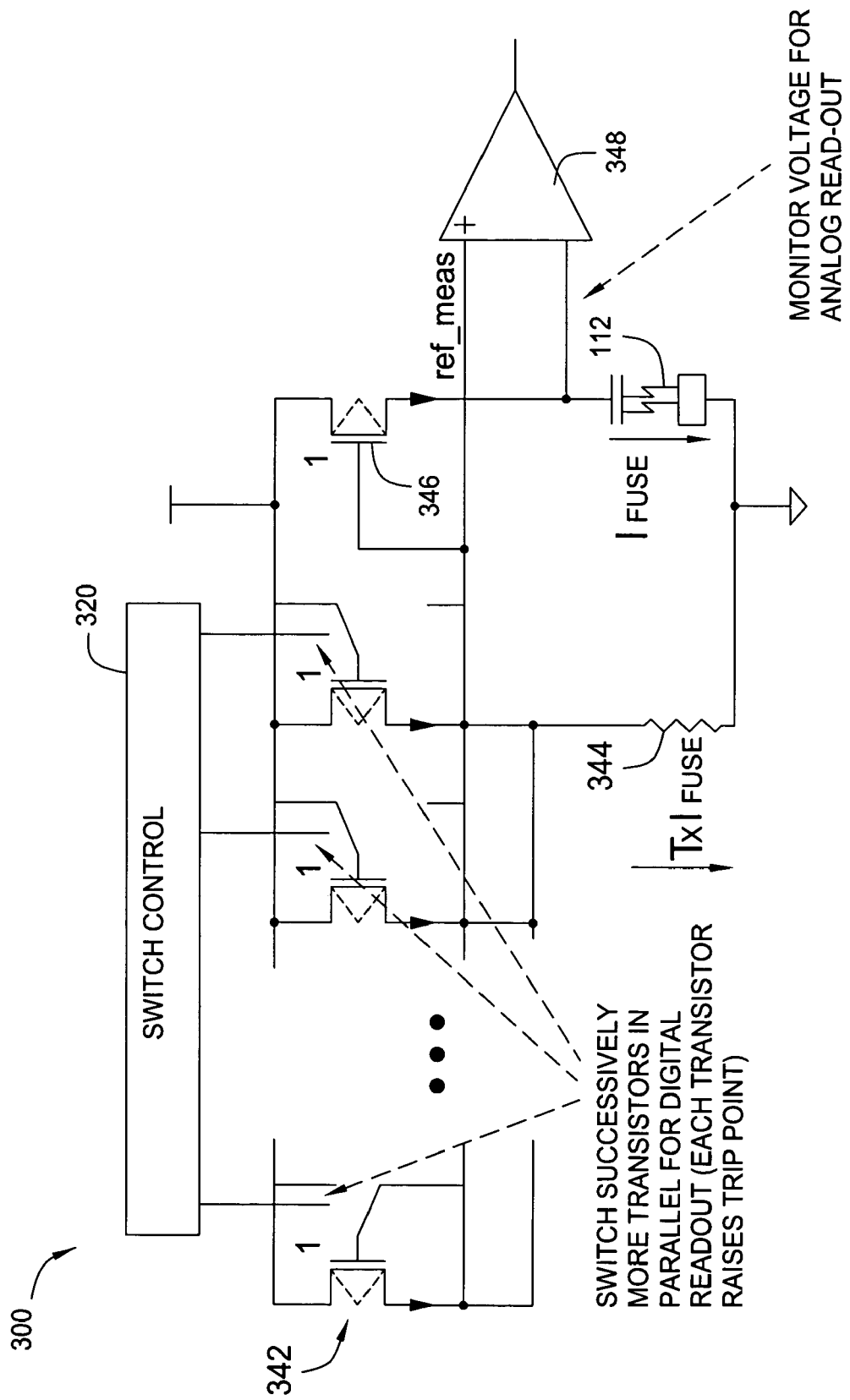
FIG. 3 illustrates an exemplary antifuse stepped resistance read-out circuit.

For some embodiments, a plurality of transistors may be successively switched in parallel in a similar readout circuit to effectively alter the variable N to achieve a digital "stepped" fuse resistance readout. For example, FIG. 3 illustrates an exemplary readout circuit 300, in which a plurality of transistors 342 may be successively switched in parallel to alter the amount of current through a reference resistor 344. By monitoring the switching point of comparator circuit 348 as transistors are added in parallel, an approximate resistance of the antifuse 112 can be determined based on the relationship between the reference resistance and the anti-fuse resistance shown in the equation above.

Figure 4:
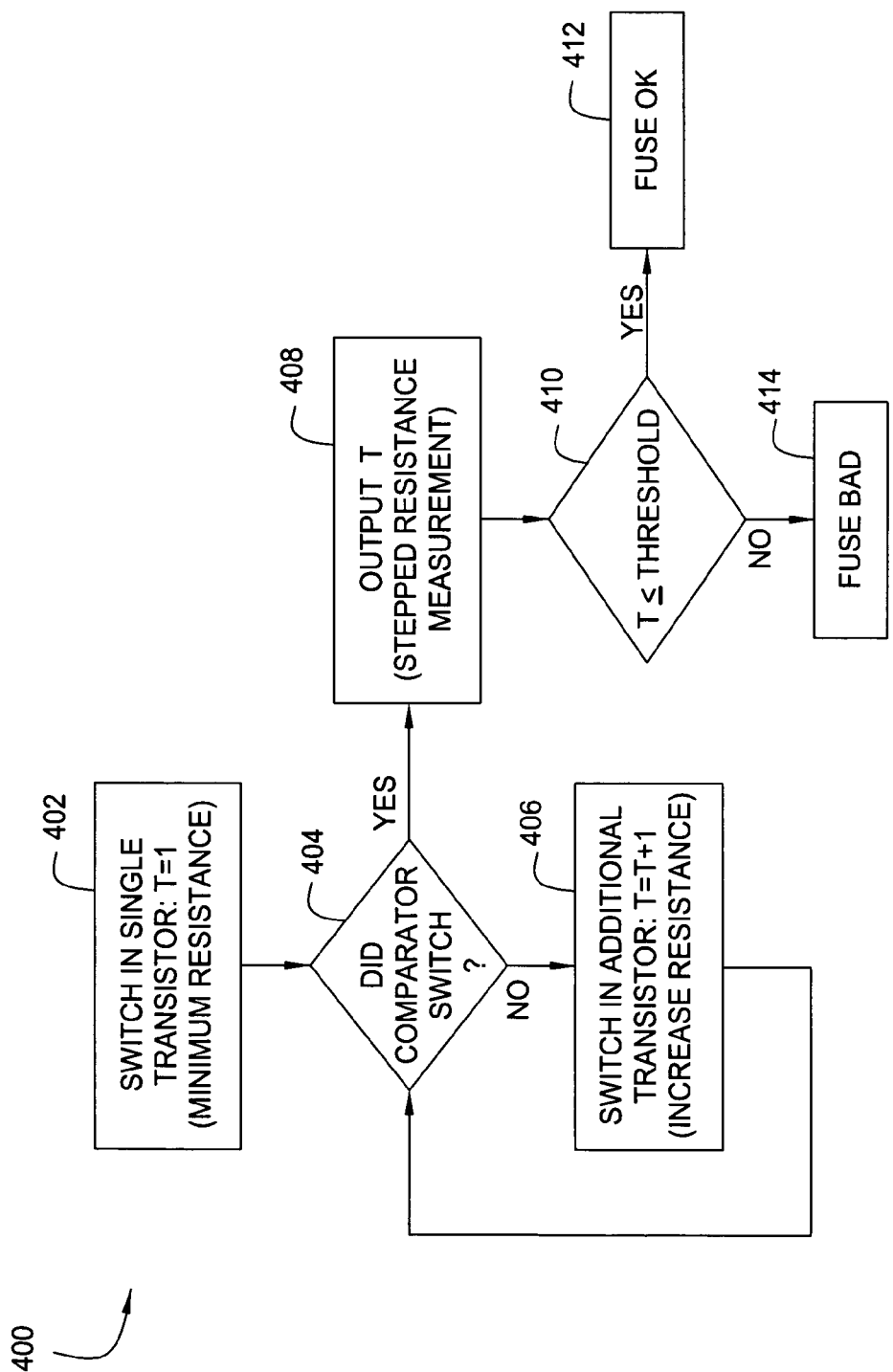
FIG. 4 illustrates a flow diagram of exemplary operations for reading out fuse resistance in accordance with one embodiment of the present invention.

Operation of the readout circuit 300 may be understood with reference to FIG. 4, which is a flow diagram of exemplary operations 400 that may be performed to obtain a digital fuse resistance readout. For some embodiments, the operations 400 may be performed in response to external commands (e.g., issued by tester 150 shown in FIG. 1). For some embodiments, one or more of the operations may be performed as part of a built in self test (BIST) and resistance measurements or threshold comparisons may be recorded and subsequently read out.

The operations 400 begin, at step 402, by switching in a single transistor (T=1). This setting would correspond to a minimum amount of current flowing through the reference resistor 344. If the same size transistors (342 and 346) are used in the reference and fuse legs of the current mirror, switching of the comparator at this minimum setting would indicate the anti-fuse resistance is below $R_{REF}$ and, assuming $R_{REF}$ is significantly lower than (e.g., by a factor of 10) the "unblown" resistance, the anti-fuse 112 fuse is well blown.

If the comparator circuit did not switch, as determined at step 404, an additional transistor is switched in parallel, at step 406. Steps 404 and 406 may then be repeated, to increase the number of transistors switched in parallel, thereby increasing the amount of current through the reference resistor 344, until the comparator switches. Once the comparator switches, the number of transistors (T) may be output as a digital indication of the anti-fuse resistance, at step 406.

Optionally, the number of transistors required to switch the comparator circuit may be compared against a threshold number, at step 410, for example, to determine whether a blow process for a corresponding fuse was successful or not. The comparison may be done external to a device (e.g., by tester 150 after reading out the transistor numbers for a plurality of fuses) or internal to a device (e.g., as part of a BIST operation). In any case, the threshold number may correspond to a particular resistance and provide for some margin of error. If the threshold is not exceeded, the anti-fuse resistance is sufficiently low and the anti-fuse is considered well blown, at step 412. On the other hand, if the threshold is exceeded, the anti-fuse resistance is excessively high and the anti-fuse is not considered well blown, at step 414.

Assuming the actual fuse latch circuits utilize a factor of N, as shown in FIG. 2, the threshold value may be set to a value below N to provide some type of safety margin. As an example, assuming N=10, the threshold value may be set to four or five to ensure fuses are well blown and provide some safety margin. In other words, even if operating conditions (e.g., operating temperatures or supply voltages) vary substantially in the field, a fuse latch may successfully readout a corresponding anti-fuse 112 with some level of assurance.

While the operations described above assumed transistors of a common size are successively switched in parallel, for some embodiments, different sized transistors may be used. For example, for some embodiments, transistors of successively larger sizes (e.g., ×2, ×3, ×4, etc.) may be switched in rather than switching in multiple transistors in parallel. For some embodiments, transistors of multiple sizes may be switched in parallel, for example to provide coarse and fine changes in current, which might allow accurate resistance readouts with reduced time. In other words, large transistors may be switched in successively until the comparator switches to determine a resistance range, after which one of the large transistors may be switched out and smaller transistors switched in successively until the comparator switches to determine a particular resistance within the range. Further, for some embodiments, rather than alter the current, the actual resistance in the reference leg of the current mirror may be altered directly, for example, by successively switching in additional resistive elements in series or selectively switching in different size resistive elements.

The operations described above may be performed at various design and manufacturing stages, and to various extents. For example, during a relatively early stage of development, digital resistance values may be taken for all or a relatively high percentage of antifuses on all or a relatively high percentage of manufactured devices, in an effort to characterize the effectiveness of a fuse blow process and/or evaluate actual fuse elements. At a later stage (e.g., after gaining some degree of confidence in the fuse blow process and/or fuse elements), a smaller number or percentage of fuses and/or devices may be tested to detect failures.

Exemplary Readout Circuit Signal Routing

As previously described, for some embodiments, fuse blow circuitry and fuse resistance readout circuitry may utilize common signal paths. As illustrated in FIG. 5, for some embodiments, fuse blow circuitry and fuse readout circuitry may be provided in a common circuit block 510 that is shared between multiple fuses. Each anti-fuse 112, on the other hand, may have a separate fuse latch circuit 520. In other words, while many fuses may be latched in parallel in this arrangement, only a single fuse may be blown at a time or have its resistance measured.

A common set of signal paths 502 and 504 may run between the common fuse blow and readout circuit block 510 and each fuse latch circuit 520. Switch circuits 532, 534, and 536, may be used to route different signals on the signal paths 502 and 504, depending on a particular mode of operation. As illustrated, the switch circuits 532-536 may be controlled by a set of test mode signals TM<1,0>, which may indicate a particular mode of operation (e.g., fuse blow, fuse resistance readout, or normal operation).

Figure 6A:
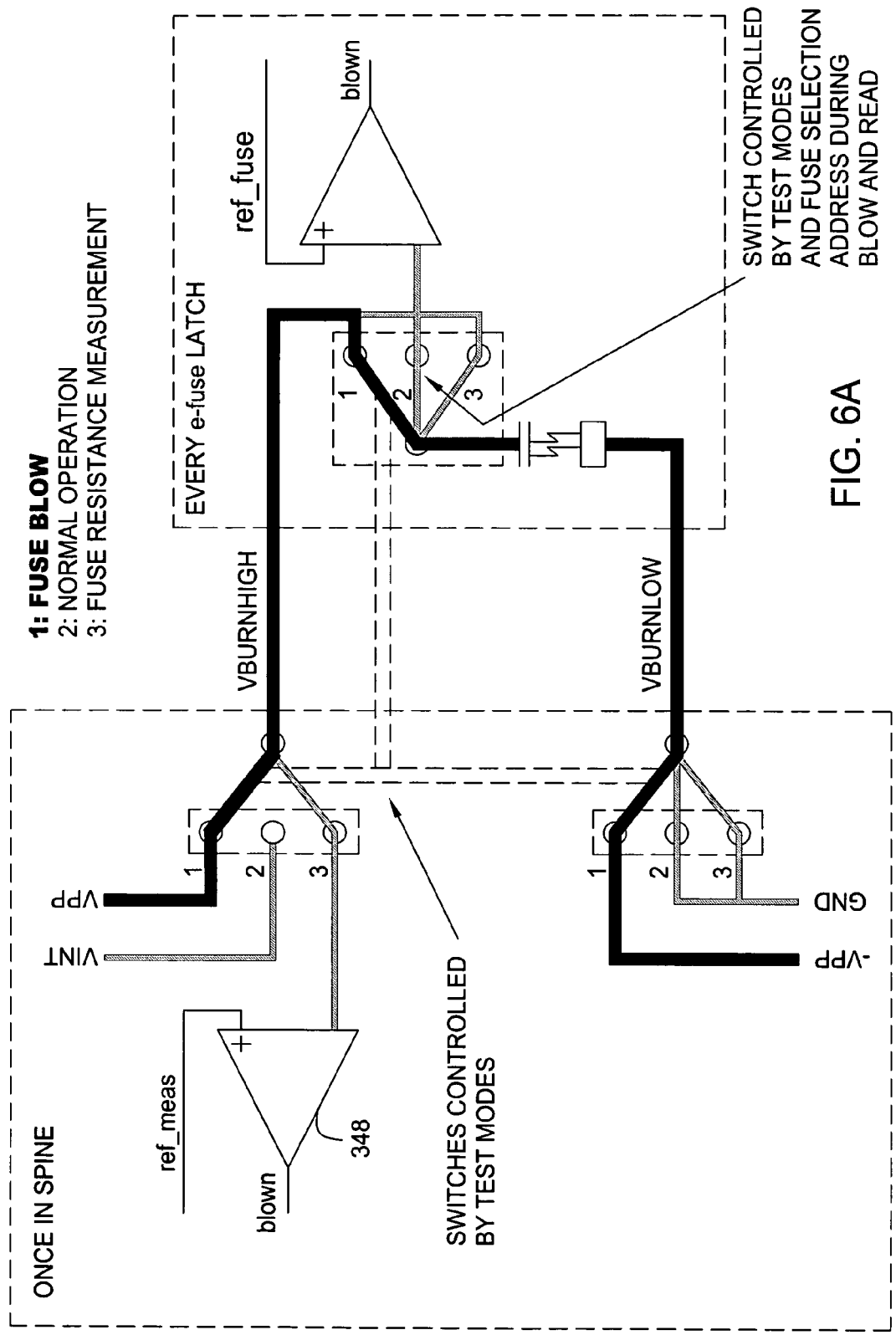
FIGS. 6A-6C illustrates how the circuits of FIG. 4 may be selectively utilized for fuse blowing, fuse latch sensing, and fuse resistance measurement.
Figure 6B:
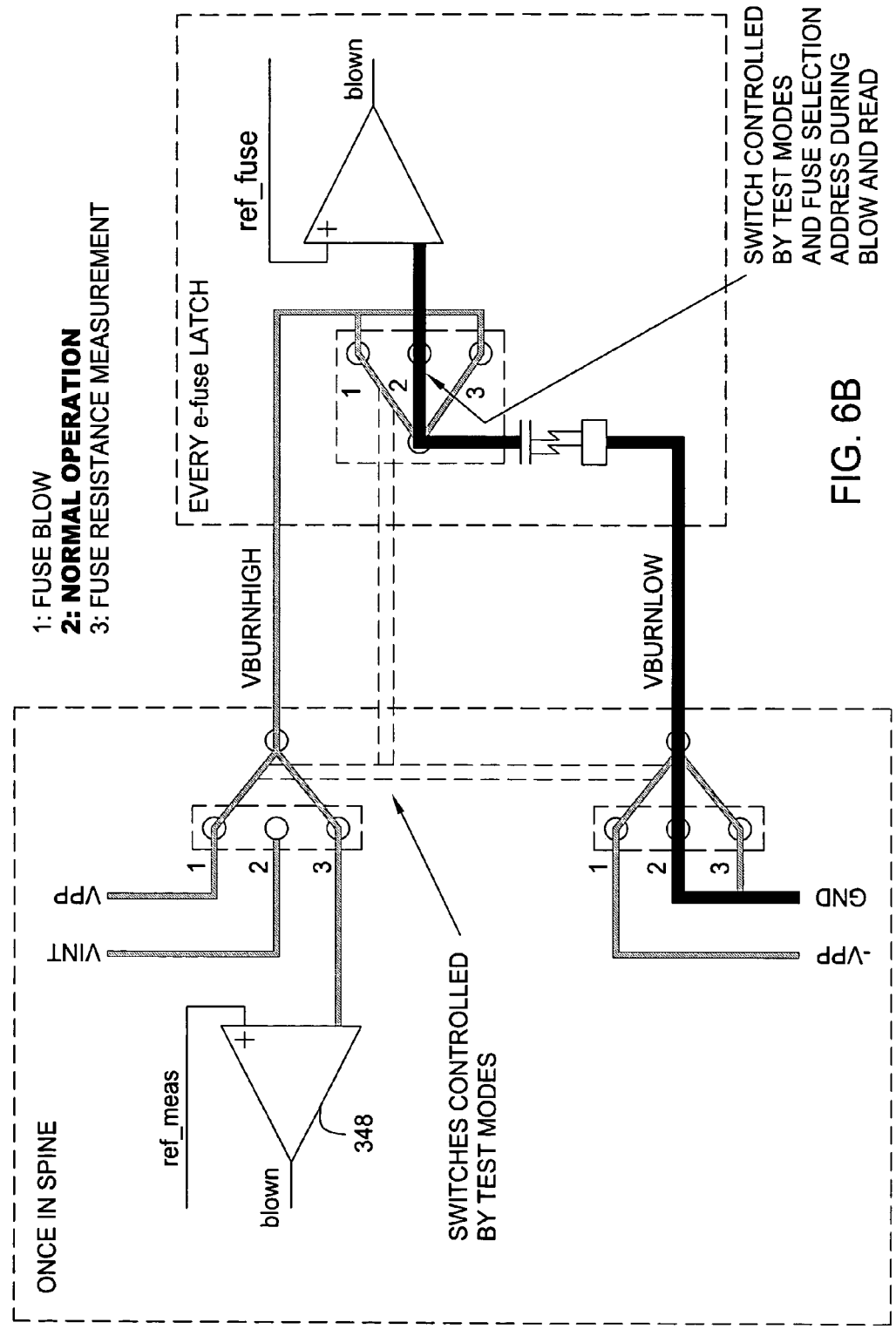
Figure 6C:
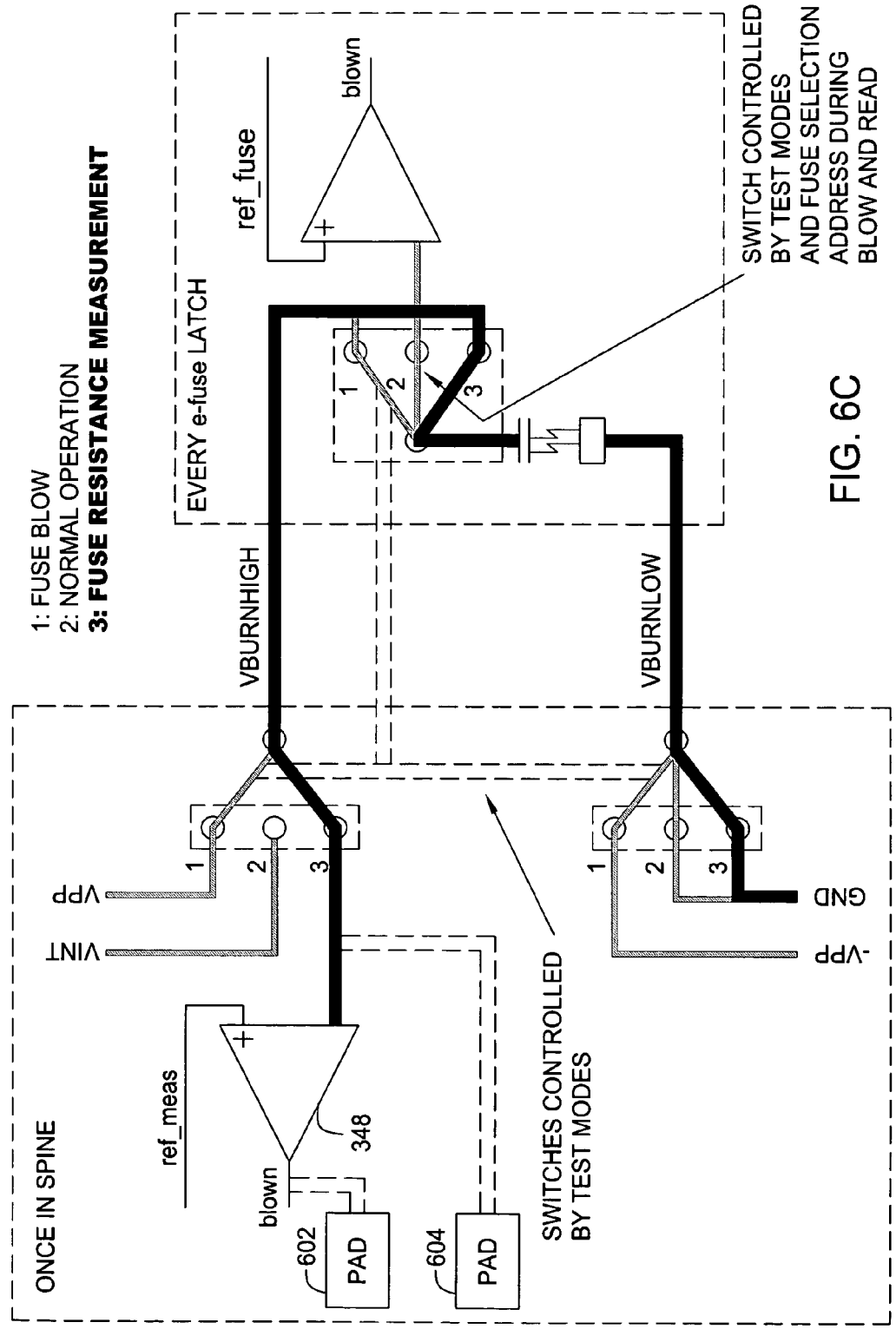

FIGS. 6A-6C illustrates how the switch circuits 532-536 may be controlled to route signals utilized for fuse blowing, fuse latch sensing, and fuse resistance measurement, respectively. Referring first to FIG. 6A, the switch circuits 532-536 are placed in a first position for fuse blowing. In the first position, switch circuits 532 and 536 route a blow voltage (illustratively VPP) to one side of the anti-fuse 112 via signal path 502, while switch circuit 534 routes a negative blow voltage (illustratively −VPP) to the other side of the anti-fuse 112 via signal path 504, in order to blow the fuse. VPP and −VPP are only used for illustrative purposes and any signals (e.g., a large positive voltage signal and GND) resulting in sufficient voltage across the anti-fuse 112 to cause blowing may be used.

Referring next to FIG. 6B, the switch circuits 532-536 are placed in a second position for fuse latch sensing (which may be considered normal operation). In the second position, switch circuit 532 may be isolated from signal path 502, while switch 536 may connect one side of the anti-fuse 112 to the latch comparator 148, while the switch circuit 534 may route the other side of the anti-fuse 112 to ground. As illustrated, the voltage across a reference resistor (labeled ref_fuse) is routed to the other input of the comparator 148, thus completing the circuit, as shown in FIG. 2 and described above.

Referring next to FIG. 6C, the switch circuits 532-536 are placed in a third position for reading resistance readout. In the third position, switch circuits 532 and 536 route one side of the anti-fuse 112 to the resistance readout comparator 348, via signal path 502, while switch circuit 534 may route the other side of the anti-fuse 112 to ground. As illustrated, the voltage across a reference resistor, varied by selectively switching transistors (labeled ref_meas) is routed to the other input of the comparator 148, thus completing the circuit, as shown in FIG. 3. In this configuration, the number of transistors connected in parallel may be successively increased (via switch control circuit 320) while monitoring the output of the comparator 348 to detect a switching point, as described above.

For some embodiments, the output of the comparator 348 (labeled meas/comp) may be monitored with internal logic (e.g., BIST circuitry). For some embodiments, the output of the comparator 348 may be routed to an external pad 602, allowing external monitoring while varying the number of transistors in parallel (e.g., by tester 150). For some embodiments, the state of the output of the comparator 348 may be available as a bit in a status register (e.g., that may be polled by the tester 150). For some embodiments, the side of the anti-fuse 112 input to the comparator may be routed to an external pad 604, allowing actual (analog) resistance measurements to be taken across the anti-fuse 112, for example, via an ohmmeter connected to pad 604 and a GND pad.

CONCLUSION

By selectively altering an effective resistance to which a fuse (or anti-fuse) resistance is compared, embodiments of the invention allow a "stepped" digital readout of fuse resistance. As a result, a greater degree of confidence in the fuse blow process may be obtained than with conventional binary (blown/not-blown) readout.

While the foregoing is directed to embodiments of the present invention, other and further embodiments of the invention may be devised without departing from the basic scope thereof, and the scope thereof is determined by the claims that follow.

What is claimed is:

1. A method for providing an indication of a resistance across a programmable fuse element within an integrated circuit device, comprising:
   (a) adjusting an effective reference resistance;
   (b) comparing the resistance across the fuse to the effective reference resistance;
   (c) if an outcome of the comparison is a first result, repeating steps (a) and (b); and
   (d) if the outcome of the comparison is a second result, providing an indication of the effective reference resistance.

2. The method of claim 1, wherein the programmable fuse element is an anti-fuse element having a resistance that is reduced after a blow process.

3. The method of claim 1, wherein adjusting the effective reference resistance comprises selectively switching one or more resistive elements to alter the total resistance in a reference path.

4. The method of claim 1, wherein comparing the resistance across the fuse to the effective reference resistance comprises comparing a voltage across the fuse to a voltage across a resistive element having a known resistance.

5. The method of claim 3, wherein adjusting the effective reference resistance comprises selectively switching one or more transistors to control a current through a resistive element having a known resistance.

6. The method of claim 5, wherein adjusting the effective reference resistance comprises adding an additional transistor in parallel to increase a current through a resistor with a known resistance.

7. A method for obtaining a digital readout of a resistance across a programmable fuse element within an integrated circuit device, comprising:
   (a) adjusting a number of transistors connected in parallel to control a current flow through a resistor having a known resistance;
   (b) monitoring an output of a comparator circuit that compares a voltage across the fuse element to a voltage across the resistor;
   (c) if the output of the comparator circuit is in a first state, repeating steps (a) and (b); and
   (d) if the output of the comparator circuit is in a second state, providing the number of transistors connected in parallel as an indication of the resistance across the programmable fuse element.

8. The method of claim 7, wherein:
   the programmable fuse element is a an anti-fuse element having a resistance that is reduced after a blow process; and
   adjusting the number of transistors connected in parallel comprises increasing the number of transistors in parallel.

9. The method of claim 7, wherein adjusting the number of transistors connected in parallel is performed in response to a command issued to the device.

10. The method of claim 7, wherein adjusting the number of transistors connected in parallel is performed as part of a built-in self test (BIST) operation of the device.

11. The method of claim 7, further comprising comparing the number of transistors to a threshold value to determine if the programmable fuse element is successfully blown.

12. The method of claim 9, wherein monitoring the output of the comparator circuit comprises monitoring an external pad to which the output of the comparator circuit is routed.

13. An integrated circuit device, comprising:
   a plurality of programmable fuse elements;
   readout circuitry configured to provide a non-binary indication of resistance of one or more of the programmable fuse elements;
   first and second external pads allowing for analog measurements of the resistance across a selected one of the programmable fuse elements; and
   the readout circuitry comprises switching circuitry to provide a first signal path from one side of the selected programmable fuse element to the first external pad and a second signal path from another side of the selected programmable fuse element to the second external pad.

14. An integrated circuit device, comprising:
   a plurality of programmable fuse elements;
   a comparator circuit for comparing a voltage across a selected one of the programmable fuse elements to a voltage across a reference resistor having a known resistance; and
   control circuitry configured to successively switch a number of transistors in parallel to control the amount of current flowing through the reference resistor until an output of the comparator circuit changes state.

15. The device of claim 14, wherein the plurality of programmable fuse elements comprise anti-fuse elements having a resistance that is reduced by a blow process.

16. The device of claim 14, further comprising:
   switching circuitry configured to route a blow voltage to a selected fuse element via a first signal path when the device is in a first mode of operation and to route a voltage across a selected fuse element to the comparator circuit via the first signal path when the device is in a second mode of operation.

17. The device of claim 14, wherein:
the output of the comparator circuit may be monitored via an external pad of the device; and
the control circuitry may be controlled by externally issued commands.

18. The device of claim 14, further comprising first and second external pads allowing for analog measurements of the resistance across a selected one of the programmable fuse elements.

19. An integrated circuit device, comprising:
a plurality of programmable fuse elements;
means for comparing a resistance of a selected one of the programmable fuse elements to an effective reference resistance; and
control means for iteratively adjusting the effective reference resistance until an output of the comparing means changes state.

20. The device of claim 19, wherein the comparing means receives, as inputs, a signal indicative of a voltage across the selected programmable fuse and a signal indicative of a voltage across a reference resistor having a known resistance.

21. The device of claim 20, wherein the control means is configured to iteratively adjust the effective reference resistance by adjusting the amount of current flowing through the reference resistor.

22. The device of claim 21, wherein the control means is configured to adjust the amount of current flowing through the reference resistor by selectively switching one or more transistors in parallel.

* * * * *